US008928175B2

(12) United States Patent
Lin (10) Patent No.: US 8,928,175 B2
(45) Date of Patent: Jan. 6, 2015

(54) JUNCTION BOX, ENERGY SYSTEM AND METHOD FOR CONTROLLING THE SAME

(75) Inventor: Chien-chih Lin, Taipei (TW)

(73) Assignee: Genesys Logic, Inc., Shindian, Taipei (TW)

( * ) Notice: Subject to any disclaimer, the term of this patent is extended or adjusted under 35 U.S.C. 154(b) by 789 days.

(21) Appl. No.: 13/083,740

(22) Filed: Apr. 11, 2011

(65) Prior Publication Data

US 2012/0140380 A1 Jun. 7, 2012

(30) Foreign Application Priority Data

Dec. 7, 2010 (TW) ................................ 99142696 A (51) Int. Cl.
*H01L 31/042* (2014.01)
*H01L 31/02* (2006.01)
*H04B 3/54* (2006.01)

(52) U.S. Cl.
CPC .......... *H01L 31/02021* (2013.01); *H04B 3/548* (2013.01); *Y02E 10/50* (2013.01)
USPC ................................................. 307/77; 307/2

(58) Field of Classification Search
CPC ....................................................... H04B 3/548
USPC ...................................................... 307/77, 78
See application file for complete search history.

(56) References Cited

U.S. PATENT DOCUMENTS

| 5,066,939 | A | 11/1991 | Mansfield, Jr. |
| 7,573,372 | B2 | 8/2009 | Mogilner et al. |
| 8,502,503 | B2 | 8/2013 | Densham |
| 2004/0085692 | A1* | 5/2004 | Bodeau et al. ................... 361/82 |
| 2004/0207262 | A1* | 10/2004 | Yanagida et al. ............. 307/10.1 |
| 2008/0147335 | A1* | 6/2008 | Adest et al. ...................... 702/64 |
| 2010/0127570 | A1* | 5/2010 | Hadar et al. ..................... 307/77 |
| 2010/0139734 | A1* | 6/2010 | Hadar et al. ................... 136/244 |
| 2010/0301991 | A1* | 12/2010 | Sella et al. ...................... 340/3.1 |
| 2011/0031814 | A1* | 2/2011 | Giesler ........................... 307/77 |
| 2011/0102111 | A1* | 5/2011 | Wang ............................. 333/204 |

FOREIGN PATENT DOCUMENTS

CN 101752844 6/2010

* cited by examiner

*Primary Examiner* — Rexford Barnie
*Assistant Examiner* — David Shiao (57) ABSTRACT

A junction box for connecting a power supply unit is disclosed. The junction box includes a first connection terminal, a second connection terminal, a serial carrier interface module, and a control module. The first connection terminal and the second terminal are utilized to connect the junction box and another junction box in a serial connection. The serial carrier interface module is electrically coupled to the first connection terminal and the second connection terminal for the transmission of a carrier and a DC power, which is provided from the power supply unit. The control module is electrically coupled to the serial carrier interface module for receiving the carrier and for controlling of the transmission of the DC power according to the carrier. A power system which employs the junction boxes and a method for controlling the power system are also disclosed.

17 Claims, 9 Drawing Sheets

JUNCTION BOX, ENERGY SYSTEM AND METHOD FOR CONTROLLING THE SAME

CLAIM OF PRIORITY

This application claims priority to Taiwanese Patent Application No. 099142696 filed Dec. 7, 2010.

FIELD OF THE INVENTION

The present invention relates to a junction box and a method thereof, and especially to a junction box which connects to a power supply unit, a power system having the junction box, and a control method thereof.

BACKGROUND OF THE INVENTION

Solar energy is a pollution-free, safe renewable energy, and there is a considerable development potential. In particular, it is the current trend of energy conservation that solar cells are integrated into building materials. For instance, solar photovoltaic panels are utilized to replace the roof materials, exterior walls, or building glasses of constructions. However, because the voltage generated by a single solar photovoltaic panel is very small, a plurality of solar photovoltaic panels is often connected serially via the junction boxes for forming a larger voltage to be used.

The conventional junction box is a small box which includes a plurality of Schottky diodes and two external cables with a cathode connector and an anode connector. A conventional solar photovoltaic system is composed of a plurality of solar photovoltaic panels, a high-voltage breaker and an inverter, in which the solar photovoltaic panels are connected in serial connections via anode and cathode connectors of the junction boxes to form a terminal voltage of several hundred volts.

However, once an exception or a fire accident has occurred in the conventional solar photovoltaic system, the DC high-voltage power becomes a difficult problem to put out a fire because the continuously DC high-voltage power under natural sunshine results in death or injury to a fireman due to an electric shock thereof.

For instance, a solar energy system with N solar photovoltaic panels has N+1 electrical access points that the anode connector is connected to the cathode connector. In order to avoid that the DC high voltage occurs at any electrical access points, the best way is to disconnect all the N+1 electrical access points. However, when a fire occurs, it is indeed difficult to disconnect a large number of the electrical access points safely and quickly for implementing a fire fighting. Currently, the only way is to isolate it from other combustibles and then leave the fire to burn the solar photovoltaic panels out, but the fire on the roof may burn into the building to cause serious damage.

In the field of electric vehicles, the power system has also a number of battery cells connected in serial connections for supplying power to the vehicle. When a vehicle failure or overheat occurs in the vehicle, the vehicle on fire often occurs. At this point, the traditional way of the fire fighting will also have the same problem of the electric shock.

Therefore, there is a significant need for providing junction boxes and a power system using the junction boxes, which makes each junction box of the power supply unit de-serialize when a fire occurs.

SUMMARY OF THE INVENTION

Accordingly, an objective of the present invention is to provide a junction box which is connected to a power supply unit of a power system for controlling the transmission of a DC power which is provided from the power supply unit.

Another objective of the present invention is to provide a power system which can de-serialize each junction box of the power supply unit.

Still another objective of the present invention is to provide a method for controlling the power system and controlling series each junction box of the power supply unit to serialize and de-serialize.

To achieve the foregoing objectives, according to an aspect of the present invention, a junction box which is connected to a power supply unit of a power system is provided. The junction box includes a first connection terminal, a second connection terminal, at least one bypass diode, a serial carrier interface module, a switch and a control module. The first connection terminal and a second connection terminal are utilized to connect another junction box in a serial connection. The at least one bypass diode is electrically coupled to the power supply unit. The serial carrier interface module electrically coupled to the first connection terminal and the second connection terminal for transmitting a carrier and a DC power provided by the power supply unit. The switch disposed in the serial carrier interface module for turning on and turning off the DC power. The control module which is electrically coupled respectively to the serial carrier interface module and the switch is utilized for receiving the carrier and switching the switch according to the carrier so as to control the transmission of the DC power.

The serial carrier interface module includes a carrier line and a power line which is parallel connected to the carrier line. The carrier line is electrically coupled to the first connection terminal and the second connection terminal for transmitting the carrier. The power line is electrically coupled to the first connection terminal and the second connection terminal with parallel connecting to the carrier line for transmitting the DC power. The switch is disposed on the power line for turning on and turning off the power line. Specifically, the carrier line has a first inductor and a capacitor connected to the first inductor in a serial connection for forming a resonance circuit, and the power line is electrically connected to a positive pole and a negative pole of the power supply unit and connected to a second inductor in a serial connection.

In one preferred embodiment of the present invention, the control module includes a carrier receiver and one switch controller. The carrier receiver is electrically coupled to the carrier line for receiving the carrier. The switch controller is electrically coupled to the carrier receiver for switching the switch according to the carrier. Preferably, the switch controller is a timeout filter. The timeout filter turns off the switch when the carrier is not received beyond a predetermined time. In another preferred embodiment of the present invention, the control module includes a carrier transceiver and a codec. The carrier transceiver is electrically coupled to the carrier line for receiving the carrier having a first packet and transmitting the carrier having a second packet. The codec is electrically coupled to the carrier transceiver for decoding the first packet from the carrier and for providing the second packet to the carrier transceiver, which the codec controls the switch on and off according to the first packet. The first packet includes a de-serialized command or a serialized command. The second packet is selected from the group consisting of a voltage, a current and a temperature and a fire detection signal corresponding to the power supply unit.

According to the junction box of the present invention, the junction box has the serial carrier interface module to simultaneously transmit the carrier and the DC power. Furthermore, the control module can control the switch of the power line to turn off, and the switch of the power line can be controlled to turn on by the carrier of the carrier line.

A power system is further provided in the present invention, which includes a plurality of power supply units, a plurality of junction boxes, a manual breaker, and a carrier device. The power supply units are utilized to output a DC power. The junction boxes electrically coupled respectively to the power supply units for connecting the power supply units in a serial connection, wherein each junction box comprises a serial carrier interface module, a switch and a control module which is electrically coupled respectively to the switch and the serial carrier interface module. The manual breaker is electrically coupled between one terminal of the junction boxes and the carrier device for disconnecting the DC power. The carrier device electrically coupled to the manual breaker for generating a carrier to the junction boxes so as to control the junction boxes to de-serialize or serialize. The serial carrier interface module is utilized to transmit the carrier and the DC power, and the control module is utilized to receive the carrier and control the transmission of the DC power according to the carrier.

In one preferred embodiment of the present invention, the serial carrier interface module of each of the junction boxes comprises a carrier line and a power line. The carrier line is utilized to transmit the carrier, and the power line is parallel connected to the carrier line for transmitting the DC power. The switch is disposed on the power line for turning on and turning off the power line. In addition, the control module of each of the junction boxes includes a carrier receiver which is electrically coupled to the carrier line for receiving the carrier and a switch controller which is electrically coupled to the carrier receiver for switching the switch according to the carrier. The carrier device is a carrier generator.

In another preferred embodiment of the present invention, the control module of each of the junction boxes includes a carrier transceiver and a codec. The carrier transceiver is electrically coupled to the carrier line for receiving the carrier having a first packet and transmitting the carrier having a second packet. The codec is electrically coupled to the carrier transceiver for decoding the first packet from the carrier and for providing the second packet to the carrier transceiver, which the codec controls the switch on and off according to the first packet. The carrier device is a main control module, which the main control module is utilized to receive the carrier having the second packet and to generate the carrier having the first packet to the junction boxes so as to control the junction boxes to de-serialize or serialize.

In accordance with the power system of the present invention, the junction boxes of the present invention are utilized, and the manual breaker or the carrier device are provided for disconnect or stopping generating the carrier to the junction boxes, which makes the junction boxes disconnect the switches to de-serialize the junction boxes.

A method for controlling the power system is further provided in the present invention, the power system comprises a plurality of power supply units, a plurality of junction boxes, a manual breaker and a carrier device. Each junction box comprises a serial carrier interface module, a switch and a control module which is electrically coupled respectively to the switch and the serial carrier interface module. The serial carrier interface module has a carrier line for transmitting a carrier and a power line for transmitting a DC power. The method comprises the steps of:

(1) transmitting the DC power and the carrier to the junction boxes simultaneously, wherein the DC power is transmitted to the power line and the carrier is transmitted to the carrier line; and (2) determining the carrier by the control modules so as to turn on or turn off the switches.

In one preferred embodiment of the present invention, the step (1) of transmitting the carrier includes turning on the manual breaker for transmitting the carrier to each carrier line of the junction boxes. It also can be implemented by generating or stopping generating the carrier by the carrier device.

In addition, the step (2) includes the steps of:

(S1) determining whether a voltage of the DC power reaches a working voltage. If so, then turn off the switch, and if not, then perform step (S2); and (S2) determining whether the carrier line receives the carrier. If not, then turn off the switch, and if so, then keep the switch on.

In another preferred embodiment of the present invention, the step (1) of transmitting the carrier includes the steps of:

(S21) detecting a second packet by the carrier device to determine whether an exception has occurred. If so, then stop transmitting the carrier, and if not, then perform step (S22);

(S22) checking whether the carrier device is activated. If not, then stop transmitting the carrier, and if so, then perform step (S23);

(S23) polling the junction boxes by the carrier device;

(S24) determining whether there is an exception occurred in the power supply units. If not, then report a power supply unit status and return to step (S21), and if so, then perform step (S25); and (25) stopping transmitting the carrier or transmitting a first packet of a de-serialized command, and then issuing alerts.

In addition, the step (2) includes the steps of:

(S31) determining whether a voltage of the DC power reaches a working voltage. If not, then turn off the switch and return to step (S31), and if so, then perform step (S32);

(S32) determining whether the first packet is received. If not, then perform step (S33), and if so, then perform step (S34);

(S33) determining whether the carrier is not received beyond a predetermined time. If not, return to step (S31), and if so, then turn off the switch; and (S34) analyzing the first packet and transmitting the carrier having the second packet, and turning on or turning off the switch according to the first packet.

In accordance with the control method of the power system in the present invention, the control module of the power system is utilized to turn off the switches to de-serialize each of the junction boxes. Accordingly, the serial connections of each of the power supply units can be de-serialized in case of a fire, thereby reducing property damage.

DETAILED DESCRIPTION OF THE PREFERRED EMBODIMENTS

The present invention will now be described in detail with reference to a few preferred embodiments thereof as illustrated in the accompanying drawings. The same reference numerals refer to the same parts or like parts throughout the various Figures.

Figure 1:
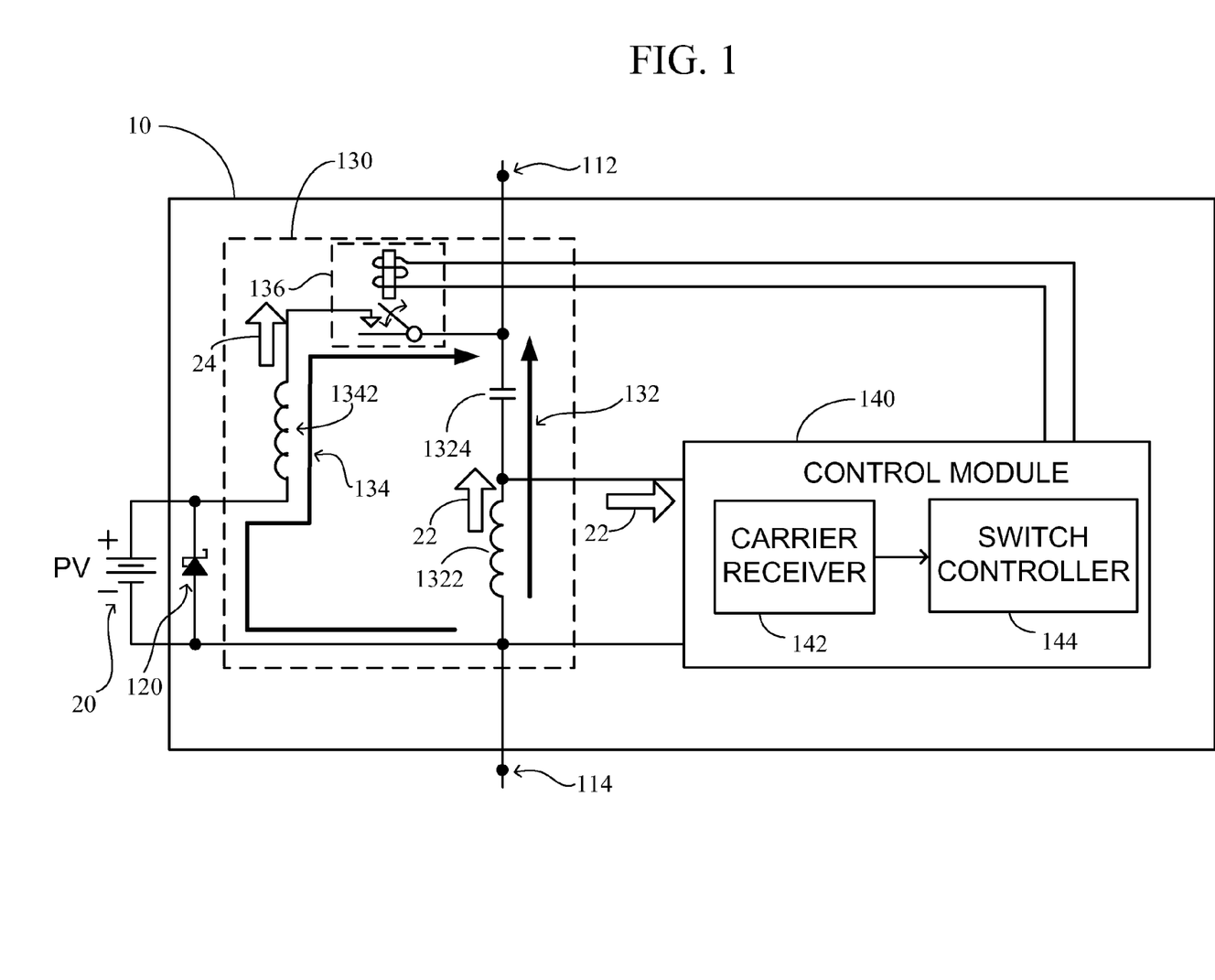
FIG. 1 is a block diagram illustrating circuit of a junction box in a power supply unit of a first preferred embodiment of the present invention.

Referring to FIG. 1, FIG. 1 is a block diagram illustrating a junction box which is connected to a power supply unit in a first preferred embodiment of the present invention, and the junction box is designated as reference numeral 10. The junction box 10 includes a first connection terminal 112, a second connection terminal 114, at least one bypass diode 120, a serial carrier interface module 130, a switch 136 and a control module 140. Preferably, the power supply unit 20 which is connected to the junction box 10 is a solar photovoltaic (PV) panel or a battery unit, and the power supply unit 20 is indicated as a battery symbol.

The first connection terminal 112 and the second connection terminal 114 are used for a serial connection of the junction box 10. For example, the first connection terminal 112 and the second connection terminal 114 are a MC4 positive connector and a MC4 negative connector respectively for the serial connection of the plurality of junction boxes 10 of the preferred embodiment of the present invention. The at least one bypass diode 120, such as a Schottky diode, is utilized to electrically couple to the power supply unit 20 to avoid a reverse voltage for protecting the power supply unit 20.

The serial carrier interface module 130 is electrically coupled to the first connection terminal 112 and the second connection terminal 114 for transmitting a carrier 22 and a DC power 24 provided by the power supply unit 24. The carrier 22 is an AC current. The switch 136 is disposed in the serial carrier interface module 130 for turning on and turning off the DC power 24.

More specifically, the serial carrier interface module 130 includes a carrier line 132 and a power line 134. The carrier line 132 is electrically coupled to the first connection terminal 112 and the second connection terminal 114 for transmitting the carrier 22. The power line 134 is electrically coupled to the first connection terminal 112 and the second connection terminal 114 with parallel connecting to the carrier line 132 for transmitting the DC power 24. The switch 136 is disposed in the power line 134 for turning on turning off the power line 134.

Specifically, the carrier line 132 has a first inductor 1322 and a capacitor 1324 connected to the first inductor 1322 in a serial connection for forming a resonance circuit, such as a series resonance circuit. The power line 134 is electrically connected to a positive pole and a negative pole of the power supply unit 20 and connected to a second inductor 1342 in a serial connection. The switch 136 is preferably a single-pole single-throw (SPST) switch, which is "on" in normal state of the power supply unit 20.

When the power supply unit 20 is working properly, the junction box 10 can transmit the DC power 24 provided from the power supply unit 20 through the power line 134. The DC power is transmitted through the first connection terminal 112 and the second connection terminal 114 which are connected to the first connection terminal 112 and the second connection terminal 114 of the other two junction boxes (not shown). Under this condition, the DC power is a steady-state current. As to the power line 134, the second inductor 1342 can be regarded as short-circuit. As to the carrier line 132, the capacitor 1324 can be regarded as an open circuit and can only transmit the carrier 22 of AC current.

The control module 140 is electrically coupled respectively to the serial carrier interface module 130 and the switch 136 for receiving the carrier 22 and switching the switch 136 according to the carrier 22 so as to control the transmission of the DC power 24. In the first preferred embodiment, the control module 140 includes a carrier receiver 142 and a switch controller 144. The carrier receiver 142 is electrically coupled to the carrier line 132 for receiving the carrier 22. The switch controller 144 is electrically coupled respectively to the switch 136 the carrier receiver 142 for controlling on and off of the switch 136 according to the carrier 22.

In the first preferred embodiment, the switch controller is a timeout filter. The timeout filter turns off the switch 136 to stop transmitting the DC power 24 when the carrier 22 is not received beyond a predetermined time. More specifically, when the power supply unit 20 is not working properly, such as a fire, etc., the input of the carrier 22 can be controlled from the outside. That makes the carrier 22 is not received by the timeout filter beyond the predetermined time, so the switch 136 is turned off so as to stop transmitting the DC power 24.

Figure 2:
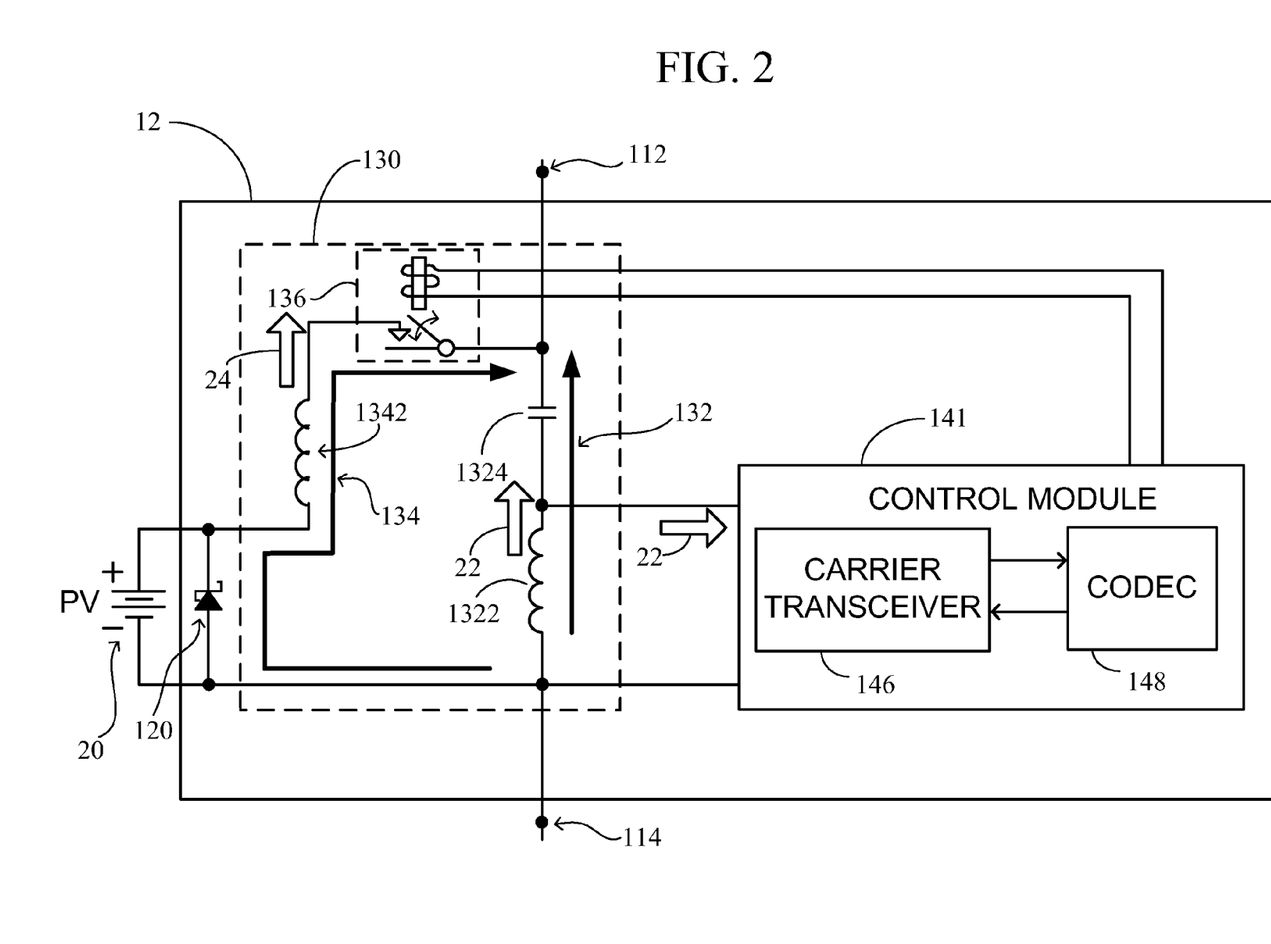
FIG. 2 is a block diagram illustrating a junction box which is connected to a power supply unit in a second preferred embodiment of the present invention.

Referring to FIG. 2, FIG. 2 is a block diagram illustrating a junction box which is connected to a power supply unit in a second preferred embodiment of the present invention, and the junction box is designated as reference numeral 12. The junction box 12 includes a first connection terminal 112, a second connection terminal 114, at least one bypass diode 120, a serial carrier interface module 130, a switch 136 and a control module 141. Preferably, the power supply unit 20 which is connected to the junction box 12 is a solar photovoltaic panel or a battery unit, and the power supply unit 20 is indicated as a battery symbol. In short, the differences between the junction box 10 of the first preferred embodiment and the junction box 12 are only the control module 141, and the remaining elements are the same to these of the junction box 10 of the first preferred embodiment. Thus, we only explain the control module 141, and the explanation of the remaining elements can be referred to the aforementioned.

The control module 141 is electrically coupled respectively to the serial carrier interface module 130 for receiving the carrier 22 and controlling the transmission of the DC power 24 according to carrier 22. In the second preferred embodiment, the control module 141 includes a carrier transceiver 146 and a codec 148. The carrier transceiver 146 is electrically coupled to the carrier line 132 for receiving the carrier 22 having a first packet (not shown) and transmitting the carrier 22 having a second packet (not shown). The codec 148 is electrically coupled to the carrier transceiver 146 for decoding the first packet from the carrier 22 and for providing the second packet to the carrier transceiver 146, which the codec 148 controls the switch 136 on and off according to the first packet. Specifically, the first packet includes a de-serialized command or a serialized command. When the decoded first packet is the de-serialized command, then the switch 136 is turned off. When the decoded first packet is the serialized command, then the switch 136 is turned on.

In the second preferred embodiment, a plurality of sensors (not shown) are connected to the codec 148. The sensors are utilized to detect information of the power supply unit 20 such as a voltage, a current, a temperature, a fire detection signal and so on, and to provide the second packet. The second packet herein corresponds to the information of the power supply unit 20 which is selected from the group consisting of a voltage, a current and a temperature and a fire detection signal. More specifically, when an improper operation of the power supply unit 20, such as a fire, is detected by the sensors, the codec 148 dispatches the second packet which contains the fire detection signal to the carrier transceiver 146. The carrier transceiver 146 can issue the carrier 22 with the second packet to the outside, and the carrier 22 with the first packet is inputted to the processor 148 from the outside for turning off the switch 136.

As mentioned above, the junction box of the present invention has the serial carrier interface module to simultaneously transmit the carrier and the DC power. Furthermore, the control module can control the switch of the power line to turn off, and the switch of the power line can be controlled to turn on by the carrier of the carrier line.

Figure 3:
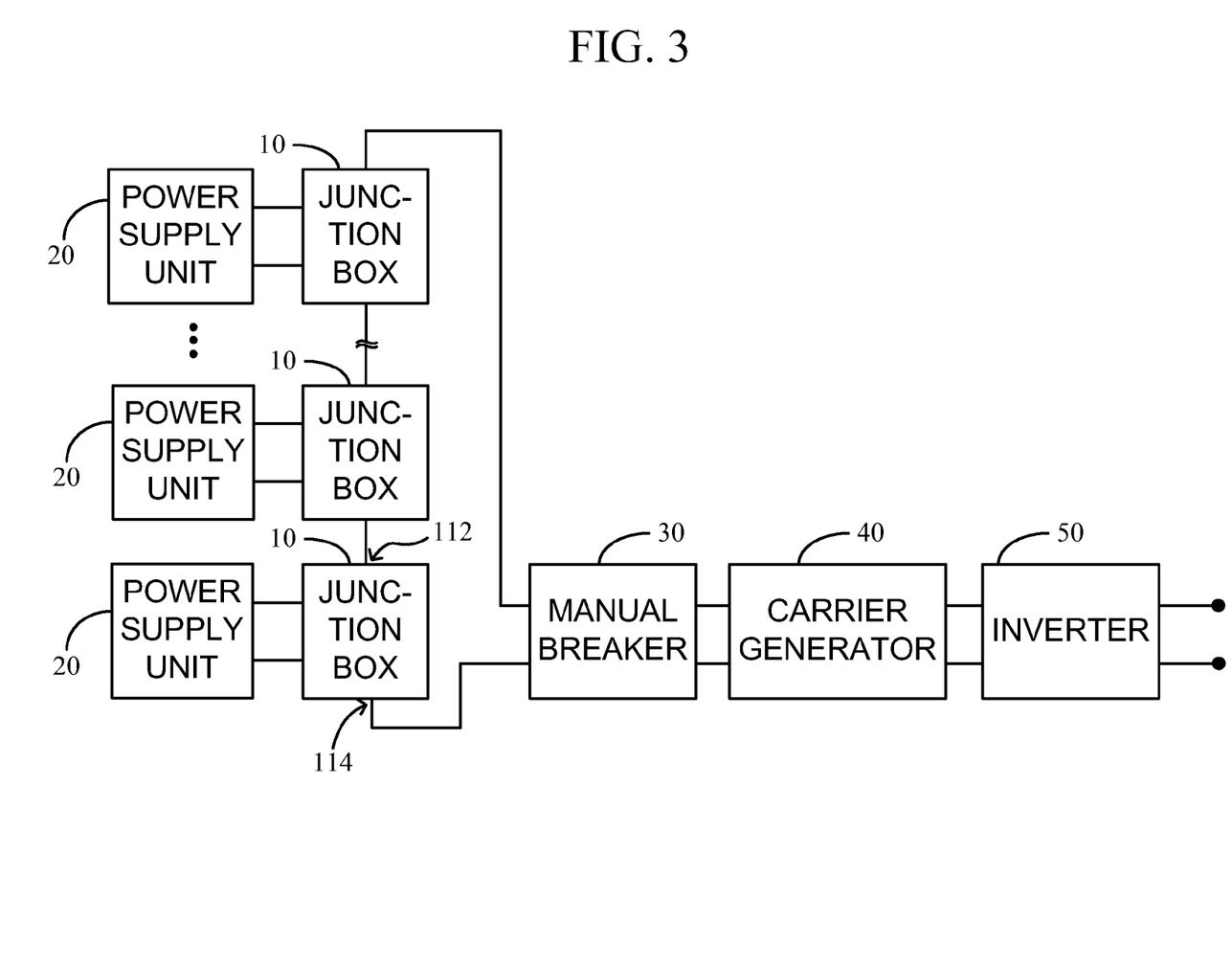
FIG. 3 is a block diagram illustrating a power system of the first preferred embodiment of the present invention.

Referring to FIGS. 1 and 3, FIG. 3 is a block diagram illustrating a power system of the first preferred embodiment of the present invention. The power system of the first preferred embodiment of the present invention is implemented by using the junction box 10 of said first preferred embodiment. the power system includes a plurality of power supply units 20, a plurality of junction boxes (such as the junction box 10 of the first embodiment), a manual breaker 30, a carrier device (such as a carrier generator 40) and an inverter 50.

The power supply units 20 are utilized to output a DC power 24. The junction boxes 10 electrically coupled respectively to the power supply units 20 for connecting the power supply units 20 in serial connections, wherein each junction box 10 comprises a serial carrier interface module 130, a switch 136 and a control module 140 which is electrically coupled respectively to the switch 136 and the serial carrier interface module 130. The manual breaker 30 is electrically coupled one terminal of the junction boxes 10 for disconnecting the DC power 24. The carrier device (such as the carrier generator 40) is electrically coupled to the manual breaker 30 for generating a carrier 22 to the junction boxes 10 so as to control the junction boxes 10 to de-serialize or serialize. The inverter 50 is utilized to convert the DC power 24 into an AC power served as utility power.

Referring to FIG. 1 again, wherein the serial carrier interface module 130 is electrically coupled to the first connection terminal 112 and the second connection terminal 114 for transmitting the carrier 22 and the DC power 24 supplied by the power supply unit 24. The switch 136 is disposed in the serial carrier interface module 130 for turning on and turning off the DC power 24. The control module 140 is electrically coupled respectively to the serial carrier interface module 130 and the switch 136 for receiving the carrier 22 and switching the switch 136 according to the carrier 22 so as to control the transmission of the DC power 24. Furthermore, the serial carrier interface module 130 of each of the junction boxes 10 comprises a carrier line 132 and a power line 134 as mentioned above. The carrier line 132 is electrically coupled to the first connection terminal 112 and the second connection terminal 114 for transmitting the carrier 22. The power line 134 is electrically coupled to the first connection terminal 112 and the second connection terminal 114 with parallel connecting to the carrier line 132 for transmitting the DC power 24. The switch 136 is disposed on the power line 134 for turning on turning off the power line 134.

In the power system of the preferred embodiment of the present invention, each of the junction boxes is the junction box 10 of said first preferred embodiment. The control module 140 of each junction box 10 includes a carrier receiver 142 and a switch controller 144. Similarly, the carrier receiver 142 is electrically coupled to the carrier line 132 for receiving the carrier 22. The switch controller 144 is electrically coupled respectively to the switch 136 the carrier receiver 142 for controlling on and off of the switch 136 according to the carrier 22. It should be noted that the carrier device to match the junction box 10 of said first preferred embodiment is a carrier generator 40.

For example, the switch controller 144 is a timeout filter. The timeout filter turns off the switch 136 to stop transmitting the DC power 24 when the carrier 22 is not received beyond a predetermined time. More specifically, when one of the power supply units 20 is not working properly, such as a fire, the carrier generator 40 can stop generating the carrier 22. That makes the carrier 22 is not received by the timeout filters beyond the predetermined time, so the switches 136 are turned off to stop transmitting the DC power 24 and to de-serialize the serial connections.

It is worth mentioning that although the switches 136 of the power lines 134 become open circuits and are unable to transmit DC power 24, the carrier lines 132 can transmit AC signal to each of the junction boxes 10 because the carrier lines 132 has the first inductor 1324 and a capacitor 1322 for forming a series resonance circuit. Therefore, if the junction boxes 10 series, then by the carrier generator 40 may be re-generated the carrier 22 to transfer to the more timeout filter. The timeout filters control the switches 136 "on" after receiving the carrier 22, so that the power supply units 20 are connected in serial connections via the junction boxes 10.

Moreover, the manual breaker 30 can also be turned off to disconnect the DC power 24, so that the carrier 22 can not be transmitted to the timeout filters, and then the switches 136 are turned off so as to stop transmitting the DC power 24 for releasing the serial connections.

Figure 4:
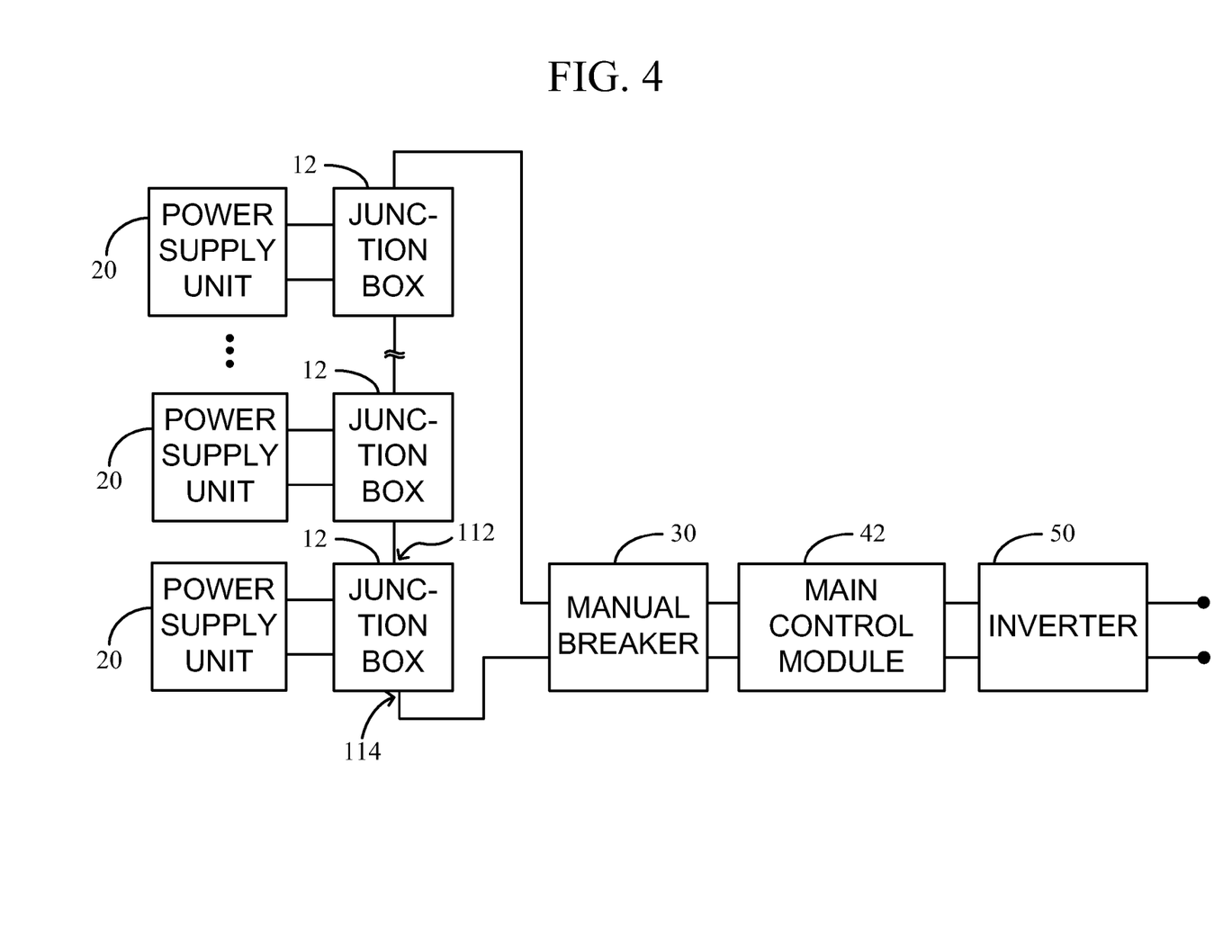
FIG. 4 is a block diagram illustrating a power system of the second preferred embodiment of the present invention.

Referring to FIGS. 2 and 4, FIG. 4 is a block diagram illustrating a power system of the second preferred embodiment of the present invention. The power system of the second preferred embodiment of the present invention is implemented in accompany with the junction box 12 of said first preferred embodiment. the power system includes a plurality of power supply units 20, a plurality of junction boxes (such as the junction box 12 of the second embodiment), a manual breaker 30, a carrier device (such as a main control module 42) and an inverter 50. In brief, the differences between the power system of the second preferred embodiment and the power system of the first preferred embodiment are only that the junction boxes 12 are the junction box 12 of said second preferred embodiment, and the carrier device is the main control module 42. The remaining elements are the same to these of the power system of the first preferred embodiment. Thus, we only explain the control module 141 and the main control module 42 of the junction boxes 12, and the explanation of the remaining elements can be referred to the aforementioned.

Referring to FIG. 2 again, the control module 141 of each of the junction boxes 12 includes a carrier transceiver 146 and a codec 148. The carrier transceiver 146 is electrically coupled to the carrier line 132 for receiving the carrier 22 having a first packet (not shown) and transmitting the carrier 22 having a second packet (not shown). The codec 148 is electrically coupled to the carrier transceiver 146 for decoding the first packet from the carrier 22 and for providing the second packet to the carrier transceiver 146, which the codec 148 controls the switch 136 on and off according to the first packet. Specifically, the first packet includes a de-serialized command or a serialized command. When the decoded first packet is the de-serialized command, then the switch 136 is turned off. When the decoded first packet is the serialized command, then the switch 136 is turned on.

Figure 5:
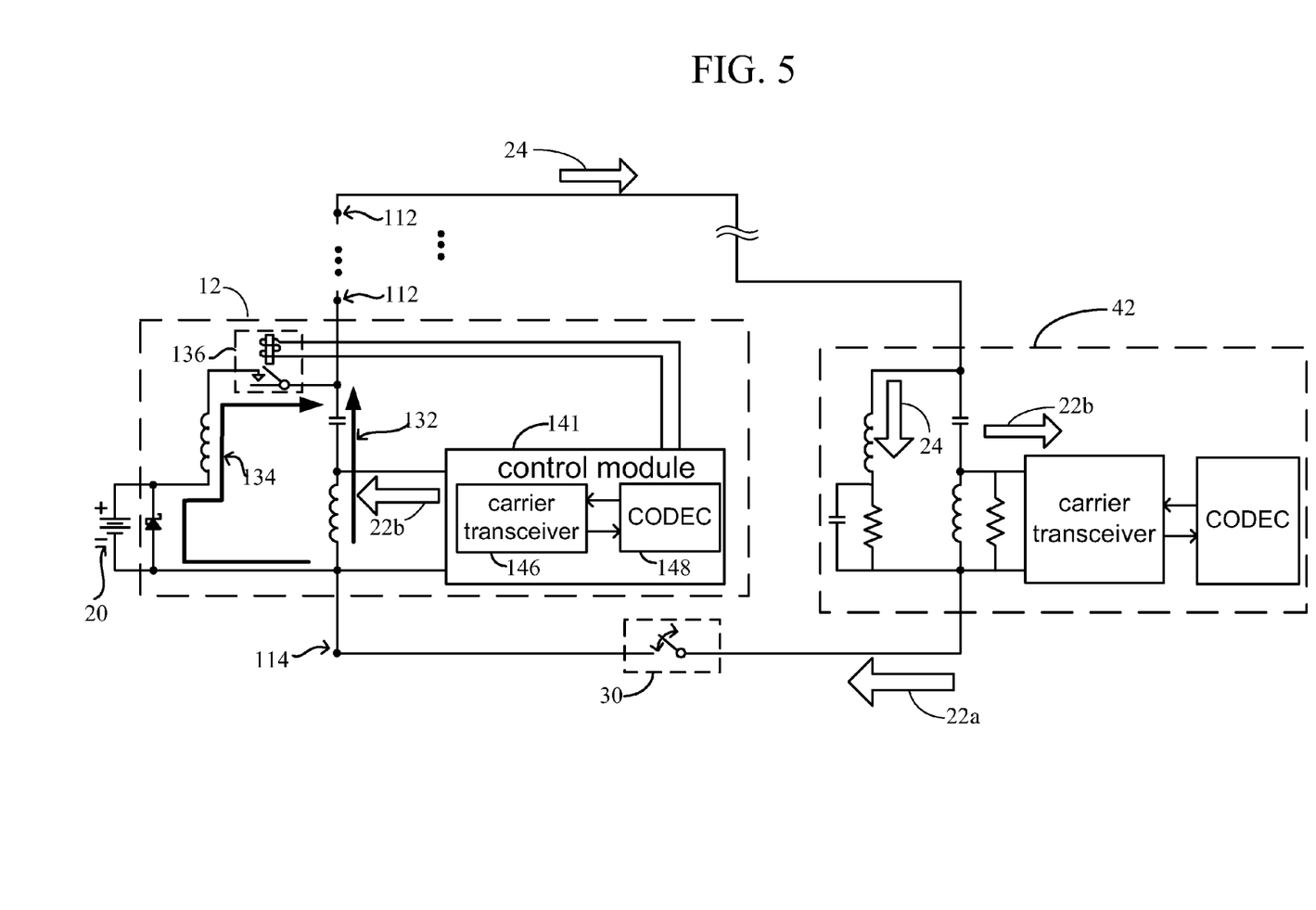
FIG. 5 is a schematic drawing illustrating a partial circuit of the power system of FIG. 4.

Referring to FIG. 5, FIG. 5 is a schematic drawing illustrating a partial circuit of the power system of FIG. 4. The descriptions of the junction box 12 have been explained when describing FIG. 2 in detail, so no further detail will be provided herein. The manual breaker 30 is connected to the second connection terminal 114 of the junction boxes 12 in serial connections for disconnecting the DC power 24 and the carrier 22.

The main control module 42 is connected between the manual breaker 30 and the inverter 50 (shown in FIG. 4), and the main control module 42 comprises a carrier transmitter, a codec, and a serial carrier interface module which are the same to the circuit of the junction box 12. The serial carrier interface module can also transmit the DC power 24 provided from the power supply unit 20, and transmit the carrier 22, and the details may refer to the description of FIG. 2. The main control module is utilized to receive the carrier 22*b* having the second packet and to generate the carrier 22*a* having the first packet to the junction boxes 12 so as to control the junction boxes 12 to de-serialize or serialize.

For instance, there are a plurality of sensors (not shown) connected to the codec 148 of the junction boxes 12. The sensors are utilized to detect information of the power supply units 20 such as a voltage, a current, a temperature, a fire detection signal and so on, and to provide the second packet. The second packet herein corresponds to the information of the power supply unit 20 which is selected from the group consisting of a voltage, a current and a temperature and a fire detection signal. When an improper operation of one of the power supply unit 20, such as a fire, is detected by the sensors, the corresponding codec 148 dispatches the second packet which contains the fire detection signal to the corresponding carrier transceiver 146. The carrier transceiver 146 can further issue the carrier 22*b* with the second packet to the main control module 42. Moreover, the codec of the main control module 42 can decode the fire detection signal of the second packet, and dispatch the carrier 22*a* with the first packet of de-serialized command The carrier 22*a* with the first packet is inputted in the carrier transmitter 146 through the carrier lines 132 of the junction boxes 12, and then the first packet is inputted in the codec 148. Similarly, the codecs 148 of the junction boxes 12 can decode the de-serialized command of the first packet, thereby controlling and disconnecting the switch 136.

It is worth mentioning that although the switches 136 of the power lines 134 become open circuits and are unable to transmit DC power 24, the carrier lines 132 has the first inductor 1324 and the capacitor 1322 for forming a series resonance circuit. Therefore, if the junction boxes 12 need to be re-connected in the serial connections, the main control module 42 can regenerate the carrier 22*a*, which has the first packet with a serialized command, for transmitting to the codecs 148. The codecs 148 decode after receiving the first packet with the serialized command, and the switches 136 are re-turned on, so that the power supply units 20 can be reconnected in the serial connections via the junction boxes 12.

Moreover, the manual breaker 30 also can be turned off for disconnecting the DC power 24, so that the carrier 22*a*, which has the first packet with the serialized command, can not be transmitted to the codecs 148. Consequently, the switches 136 can be turned off for releasing the serial connections when the codecs 148 do not receive the first packet with the serialized command.

In summary, the power system of the present invention employs the junction boxes of the present invention, and the manual breaker or the carrier device are provided for disconnect or stopping generating the carrier to the junction boxes, which makes the junction boxes disconnect the switches to de-serialize the junction boxes.

Referring to FIGS. 1 to 4 again, the following is a detailed description of a control method with respect to the power system of the present invention. The control method in accordance with the present invent is implemented by using the power system of the above-mentioned first and second preferred embodiment. the power system includes a plurality of power supply units 20, a plurality of junction boxes 10 or 12, a manual breaker 30 and a carrier device (such as the carrier generator 40 or the main control module 42), wherein each junction box 10 or 12 includes a serial carrier interface module 130, a switch 136 and a control module 140 or 141 which is electrically coupled respectively to the switch 136 and the serial carrier interface module 130. The serial carrier interface module 130 includes a carrier line 132, a power line 134 and a switch 136. The carrier line 132 is utilized to transmit a carrier 22, and the power line 134 is utilized to transmit a DC power 24.

Figure 6:
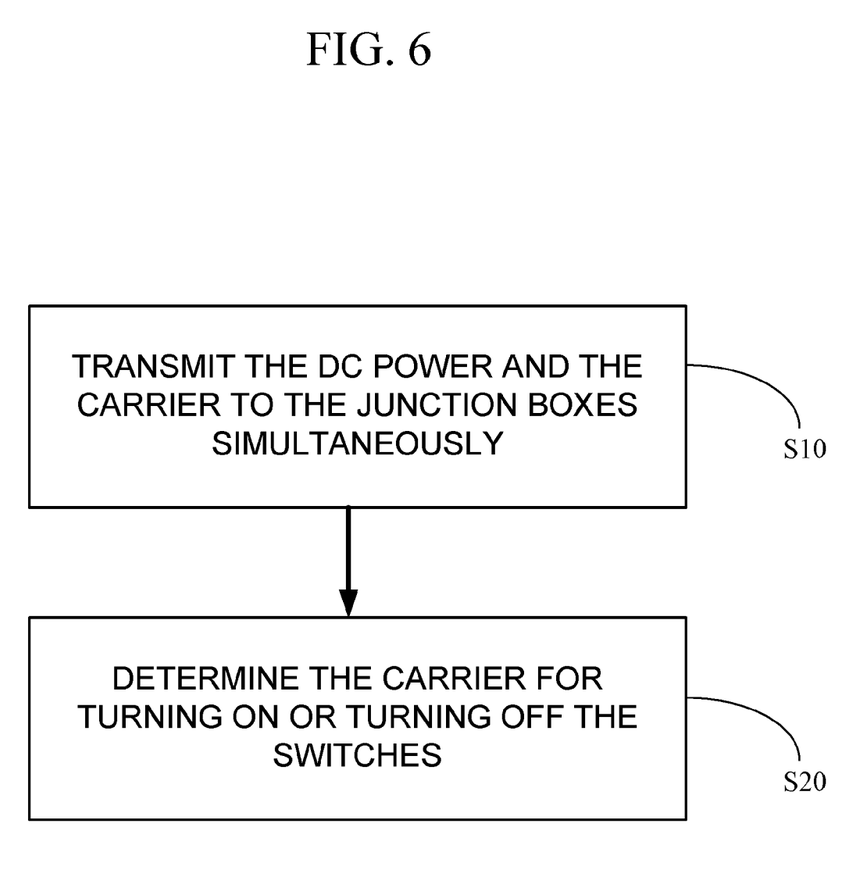
FIG. 6 is a flow chart illustrating the power system serialization or de-serialization in accordance with the present invention.

Referring to FIGS. 1, 3 and 6, FIG. 6 is a flow chart illustrating the power system serialization or de-serialization in accordance with the present invention. The control method comprises steps S10 and S20.

At step S10, the carrier 22 is transmitted or disconnected to each carrier line 132 of the junction box 10 or 12.

At step S20, the control modules 140 or 141 determine the carrier 22 so as to turn on or turn off the switches 136.

The control method of using the power system of the first preferred embodiment of the present invention will be explained in the following details, whereby the method is a manual control method. In the control method implemented by the power system of the first preferred embodiment of the present invention, the step S10 of transmitting or disconnecting the carrier 22 includes turning on or turning off the manual breaker 30 for transmitting or disconnecting the carrier 22 to each carrier line 132 of the junction box 10. As mentioned above, it also can be implemented by controlling the carrier device, such as the carrier generator 40, manually to generate or stop generating the carrier 22, and then the carrier 22 can be transmitted or disconnected to each carrier line 132 the junction box 10.

Figure 7:
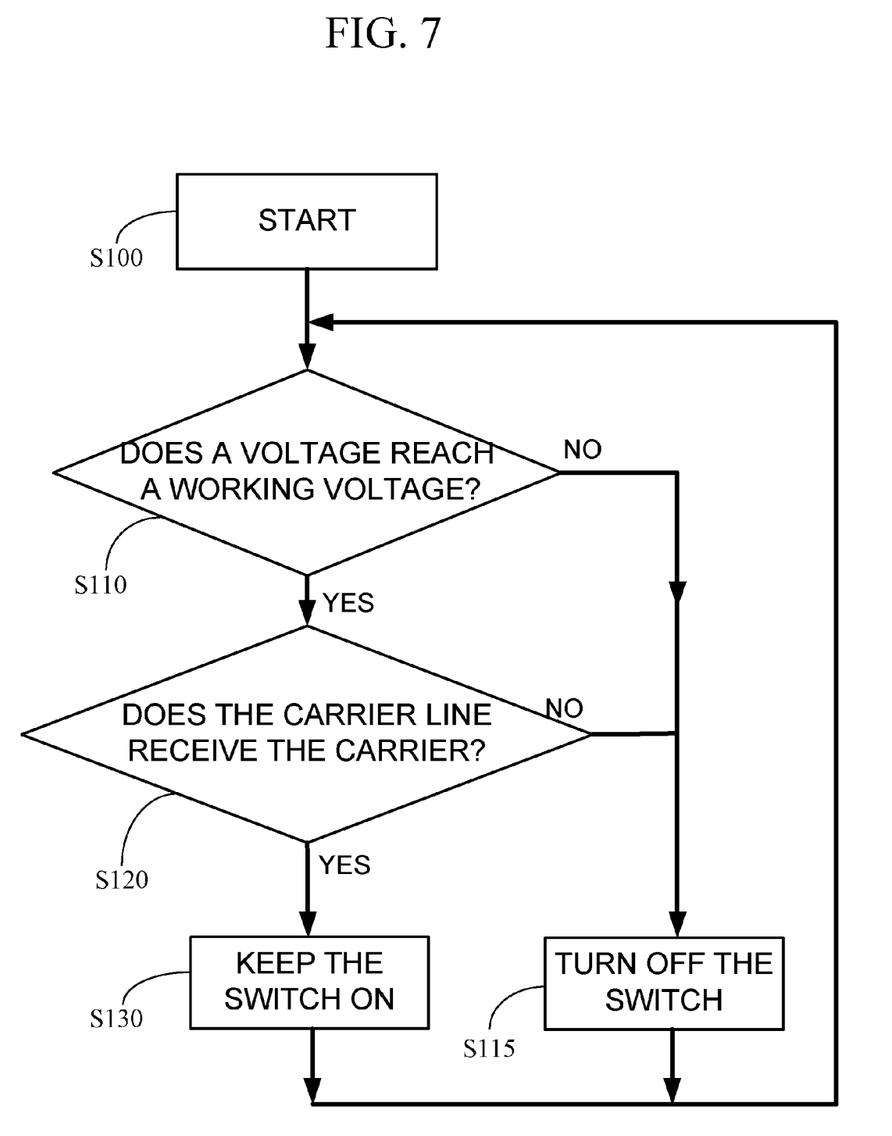
FIG. 7 is a flow chart illustrating determining processes of the control module of the first preferred embodiment.

What follows is the description of the determining processes of each junction box 10 in the manual control. Referring to FIGS. 1 and 7, FIG. 7 is a flow chart illustrating the determining processes of the control module of the first preferred embodiment. The step S20, which the control module 140 determines the carrier 22, begins with step S100.

At step S110, the control module 140 determines whether a voltage of the DC power 24 reaches a working voltage, if not, turning off the switch 136 and returning to step S110 to continue to determine, and if so, then performing step S120. The working voltage is a predetermined value, which is adjusted in accordance with the power system.

At step S115, the switch 136 is turned off, and then the determining processes is returned to step S110 to continue to determine.

At step S120, the switch controller 144 determines whether the carrier line receives the carrier 22. If not, then perform step S115, i.e. turn off the switch 136 and return to step S110 to continue to determine, and if so, then perform step S130, i.e. keep the switch 136 on.

For example, the switch controller 144 of the control module 140 is a timeout filter. While the carrier 22 is not received by the timeout filter beyond the predetermined time, the switch 136 is turned off to stop transmitting the DC power 24, thereby de-serializing the junction boxes 10.

Figure 8:
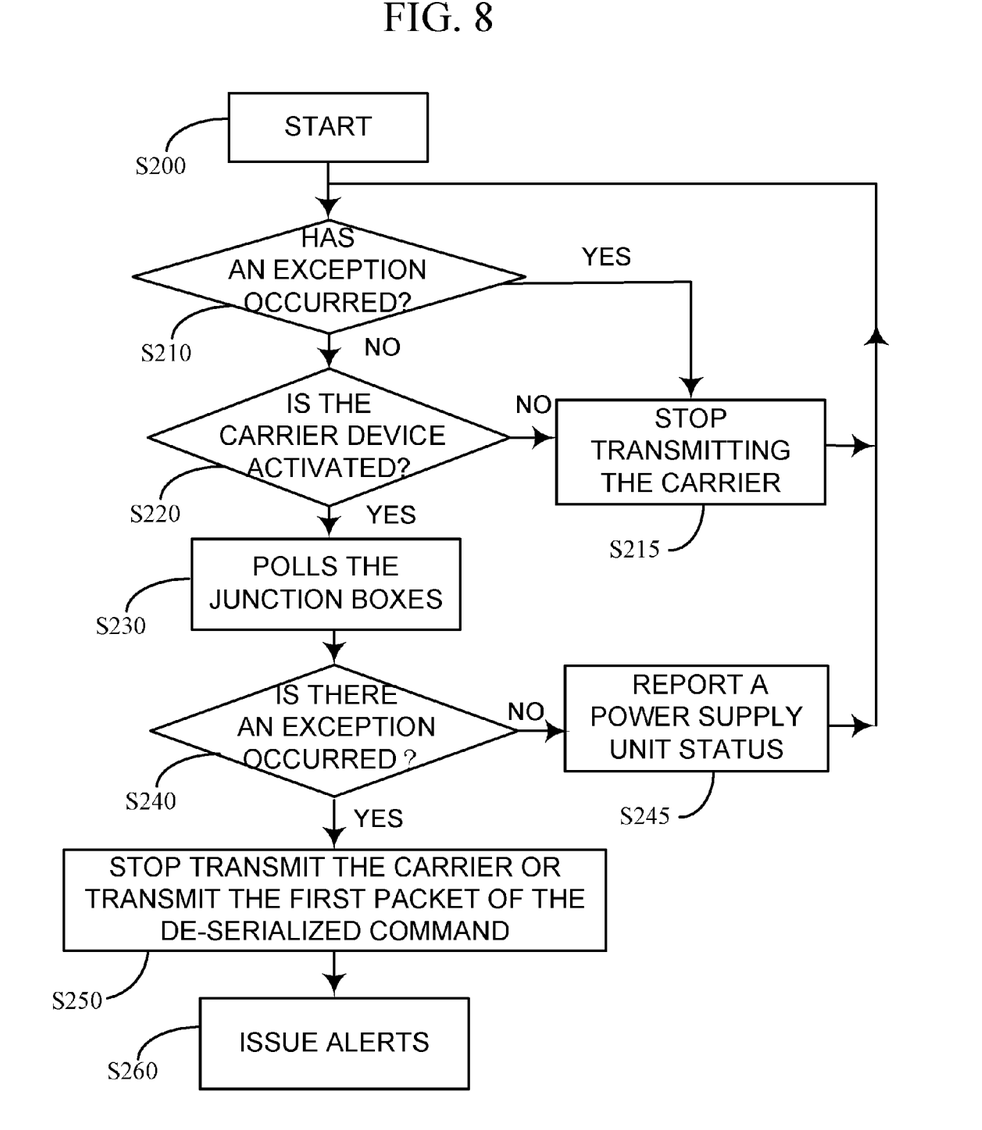
FIG. 8 is a flow chart illustrating a control of the main control unit of the second preferred embodiment.

The control method of using the power system of the second preferred embodiment of the present invention will be explained in the following details, whereby the method is an automatic early-warning control method. Referring to FIGS. 4, 5 and 8, FIG. 8 is a flow chart illustrating a control of the main control unit of the second preferred embodiment. In the control method implemented by the power system of the second preferred embodiment of the present invention, step S10 of transmitting or disconnecting the carrier 22 begins with step S200.

At step S210, the carrier device, such as the main control unit 42, detects a second packet to determine whether an exception has occurred. If so, then perform step S215, i.e. stop transmitting the carrier 22, and if not, then perform step S220. For example, the main control unit 42 receives the carrier 22 having the second packet of the fire detection signal as mentioned above, and the main control module 42 can decode the fire detection signal to determine whether the fire occurred.

At step S220, the carrier device, such as the main control unit 42, is checked whether it is activated. If not, then stop transmitting the carrier 22, and if so, then perform step S230. Specifically, the main control unit 42 has a manual button for manually activating or deactivating the main control unit 42 to send the carrier 22.

At step S230, the carrier device, such as the main control unit 42, polls the junction boxes 12. For example, a polling carrier is sent every few seconds for polling the information of the second packet of each power supply unit 20.

At step S240, the main control unit 42 determines whether there is an exception occurred in the power supply units 20. If not, then perform step S245, i.e. report a power supply unit status and return to step S210, and if so, then perform step S250. Consequently, that is, the step is to determine whether the voltage, current, temperature and fire detection signal of the power supply unit 20, which correspond to the second packet of the received carrier, are normal. If so, the reports corresponding to the voltage, current, temperature and fire detection signal of the power supply unit 20 can be generated, and returning to step S210 to continue to detect.

At step S250, the carrier 22 is stopped transmitting, or the first packet of the de-serialized command is transmitted. Specifically, the step of transmitting the first packet of the de-serialized command is to transmit the carrier 22 with the first packet of the de-serialized command, so that the switches 136 of the junction boxes 12 are turned off.

At step S260, alerts are issued to notify users.

Figure 9:
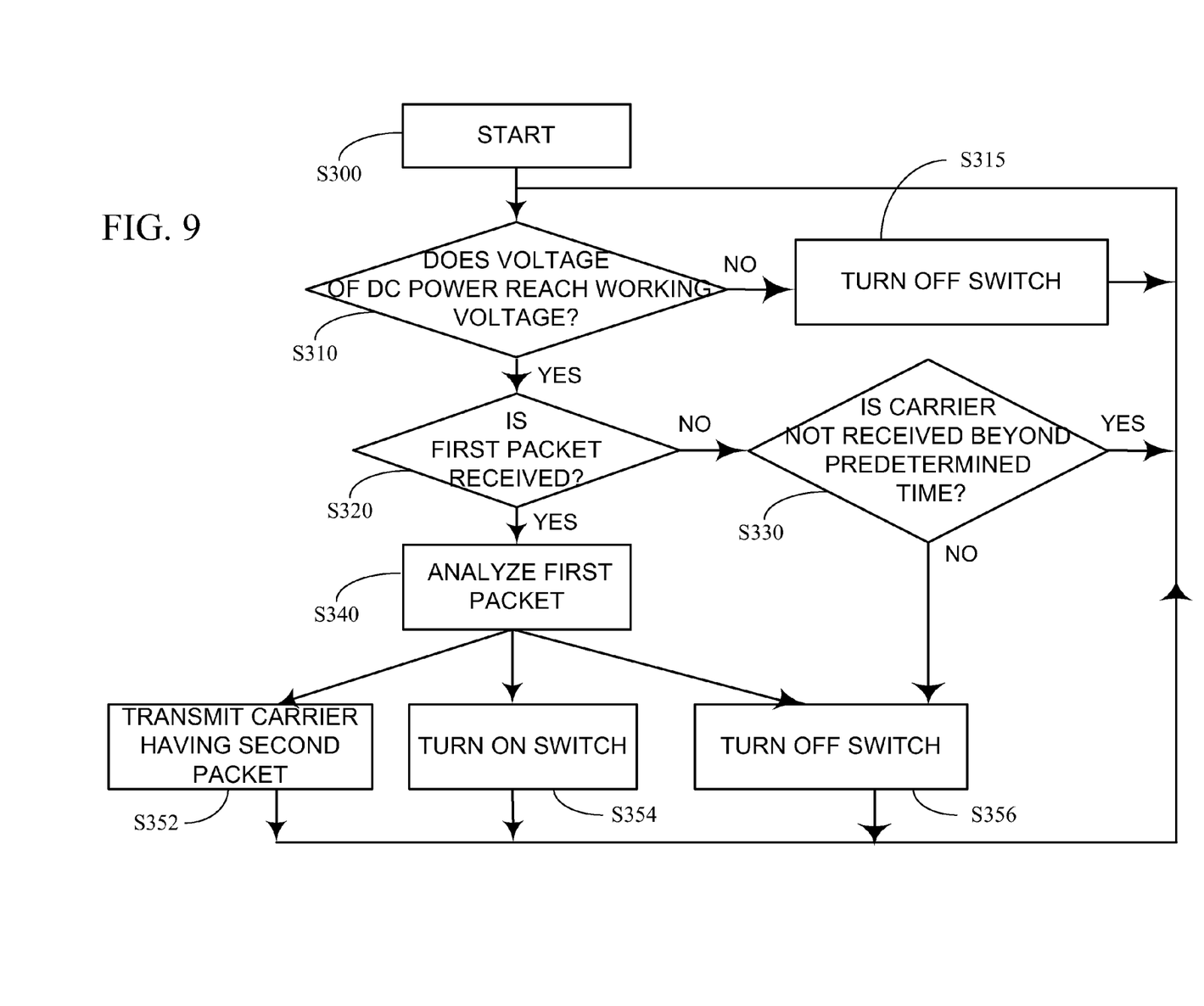
FIG. 9 is a flow chart illustrating determining processes of the control module of the second preferred embodiment.

What follows is the description of the determining processes of each junction box 12 in the automatically early-warning control. Referring to FIGS. 2 and 9, FIG. 9 is a flow chart illustrating the determining processes of the control module of the second preferred embodiment. The step S20 that the control module 141 determines the carrier 22 begins with step S300.

At step S310, the control module 141 determines whether a voltage of the DC power 24 reaches a working voltage. If not, then perform step S315, i.e. turn off the switch 136 and return to step S310 to continue to determine, and if so, then perform step S320. The working voltage is a predetermined value in accordance with the power system.

At step S320, the codec 148 of the control module 141 determines whether the first packet is received. If not, then perform step S330, and if so, then perform step S340.

At step S330, the codec 148 determines whether the carrier 22 is not received beyond a predetermined time. If so, then return to step S310, and if not, then perform step S356, i.e. turn off the switch 136. For example, the codec 148 has a timeout filtering mechanism. While the carrier 22 is not received beyond the predetermined time, the switch 136 is turned off to stop transmitting the DC power 24, thereby de-serializing the junction boxes 12.

At step S340, the codec 148 analyzes the first packet, and then perform step S352, i.e. transmit the carrier having the second packet, and perform step S354 or S356, i.e. turn on or turn off the switch according to the first packet, and finally return to step S310 to continue to determine. For example, the codec 148 decodes the first packet and provides the second packet to the carrier transceiver 146. Specifically, the first packet includes a de-serialized command or a serialized command. When the decoded first packet is the de-serialized command, then the switch 136 is turned off. When the decoded first packet is the serialized command, then the switch 136 is turned on. The second packet herein corresponds to the information of the power supply unit 20, which is selected from the group consisting of a voltage, a current and a temperature and a fire detection signal, for providing to the main control module 42 of the outside.

In summary, the control method employs the power system of the present invent as mentioned above, and the control module is utilized to turn off the switches to de-serialize each of the junction boxes. The objective that the serial connections of each power supply unit can be de-serialized when an exception occurs can be attained, thereby ensuring the safety of the operator to test or the firemen to put out a fire.

While the preferred embodiments of the present invention have been illustrated and described in detail, various modifications and alterations can be made by persons skilled in this art. The embodiment of the present invention is therefore described in an illustrative but not restrictive sense. It is intended that the present invention should not be limited to the particular forms as illustrated, and that all modifications and alterations which maintain the spirit and realm of the present invention are within the scope as defined in the appended claims.

What is claimed is:

1. A junction box for connecting a power supply unit of a power system, the junction box comprising:
    a first connection terminal and a second connection terminal for connecting another junction box in a serial connection;
    at least one bypass diode electrically coupled to the power supply unit;
    a serial carrier interface module electrically coupled to the first connection terminal and the second connection terminal for transmitting a carrier and a DC power provided by the power supply unit;
    a switch disposed in the serial carrier interface module for turning on and turning off the DC power; and
    a control module electrically coupled respectively to the serial carrier interface module and the switch for receiving the carrier and switching the switch according to the carrier so as to control the transmission of the DC power,
    wherein the serial carrier interface module comprises a carrier line and a power line, the carrier line is electrically coupled to the first connection terminal and the second connection terminal for transmitting the carrier and has a first inductor and a capacitor connected to the first inductor in a serial connection for forming a resonance circuit, and the power line is electrically coupled to the first connection terminal and the second connection terminal connected in parallel with the carrier line for transmitting the DC power, and the switch is disposed on the power line for turning on and turning off the power line.

2. The junction box of claim 1, wherein the power line is electrically connected to a positive pole and a negative pole of the power supply unit and connected to a second inductor in a serial connection.

3. The junction box of claim 1, wherein the control module comprises:
a carrier receiver electrically coupled to the carrier line for receiving the carrier; and
a switch controller electrically coupled to the carrier receiver for switching the switch according to the carrier.

4. The junction box of claim 3, wherein the switch controller is a timeout filter to turn off the switch when the carrier is not received beyond a predetermined time.

5. The junction box of claim 1, wherein the control module comprises:
a carrier transceiver electrically coupled to the carrier line for receiving the carrier having a first packet and for transmitting the carrier having a second packet; and
a codec electrically coupled to the carrier transceiver for decoding the first packet from the carrier and for providing the second packet to the carrier transceiver, wherein the codec controls the switch on and off according to the first packet.

6. The junction box of claim 5, wherein the first packet includes a de-serialized command or a serialized command.

7. The junction box of claim 5, wherein the second packet is selected from a group consisting of a voltage, a current and a temperature and a fire detection signal corresponding to the power supply unit.

8. A power system, comprising:
a plurality of power supply units for outputting a DC power;
a plurality of junction boxes electrically coupled respectively to the power supply units for connecting the power supply units in serial connections, wherein each junction box comprises a serial carrier interface module, a switch and a control module which is electrically coupled respectively to the switch and the serial carrier interface module; and
a carrier device electrically coupled to one terminal of the junction boxes for generating a carrier to the junction boxes so as to control the junction boxes to de-serialize or serialize,
wherein the serial carrier interface module is utilized to transmit the carrier and the DC power, and the control module is utilized to receive the carrier and control the transmission of the DC power according to the carrier;
wherein the serial carrier interface module of each of the junction boxes comprises a carrier line and a power line, the carrier line is utilized for transmitting the carrier and has a first inductor and a capacitor connected to the first inductor in a serial connection for forming a resonance circuit, and the power line is connected in parallel with the carrier line for transmitting the DC power, and the switch is disposed on the power line for turning on and turning off the power line.

9. The power system of claim 8, further comprising a manual breaker electrically coupled between one terminal of the junction boxes and the carrier device for disconnecting the DC power.

10. The power system of claim 8, wherein the control module of each of the junction boxes comprises:
a carrier receiver electrically coupled to the carrier line for receiving the carrier; and
a switch controller electrically coupled to the carrier receiver for switching the switch according to the carrier.

11. The power system of claim 8, wherein the control module of each of the junction boxes comprises:
a carrier transceiver electrically coupled to the carrier line for receiving the carrier having a first packet and transmitting the carrier having a second packet; and
a codec electrically coupled to the carrier transceiver for decoding the first packet from the carrier and for providing the second packet to the carrier transceiver, wherein the codec controls the switch on and off according to the first packet.

12. The power system of claim 11, wherein the carrier device is a main control module, which the main control module is utilized to receive the carrier having the second packet and to generate the carrier having the first packet to the junction boxes so as to control the junction boxes to de-serialize or serialize.

13. A method for controlling a power system, the power system comprising a plurality of power supply units, a plurality of junction boxes, and a carrier device, each junction box comprising a serial carrier interface module, a switch and a control module electrically coupled respectively to the switch and the serial carrier interface module, the serial carrier interface module having a carrier line and a power line, the carrier line comprising a first inductor and a capacitor connected to the first inductor in a serial connection for forming a resonance circuit for transmitting a carrier, and the power line being connected in parallel with the carrier line for transmitting a DC power, and the switch being disposed on the power line for turning on and turning off the power line, the method comprising the steps of:
(1) transmitting the DC power and the carrier to the junction boxes simultaneously, wherein the DC power is transmitted to the power line and the carrier is transmitted to the carrier line; and
(2) determining the carrier by the control modules for turning on or turning off the switches.

14. The method of claim 13, wherein the step (1) of transmitting the carrier comprises generating the carrier by the carrier device.

15. The method of claim 13, wherein the step (2) comprises the steps of:
(S1) determining whether a voltage of the DC power reaches a working voltage, if not, then turning off the switch, and if so, then performing step (S2); and
(S2) determining whether the carrier line receives the carrier, if not, then turning off the switch, and if so, then keeping the switch on.

16. The method of claim 13, wherein the step (1) of transmitting the carrier comprises the steps of:
(S21) detecting a second packet by the carrier device to determine whether an exception has occurred, if so, then stopping transmitting the carrier, and if not, then performing step (S22);
(S22) checking whether the carrier device is activated, if not, then stopping transmitting the carrier, and if so, then performing step (S23);
(S23) polling the junction boxes by the carrier device;
(S24) determining whether there is an exception occurred in the power supply units, if not, then reporting a power supply unit status and returning to step (S21), and if so, then performing step (S25); and (25) stopping transmitting the carrier or transmitting a first packet of a de-serialized command, and then issuing alerts.

17. The method of claim 13, wherein the step (2) comprises the steps of:
- (S31) determining whether a voltage of the DC power reaches a working voltage, if not, then turning off the switch and returning to step (S31), and if so, then performing step (S32);
- (S32) determining whether the first packet is received, if not, then performing step (S33), and if so, then performing step (S34);
- (S33) determining whether the carrier has been received before a predetermined time, if the carrier is received before the predetermined time, returning to step (S31), and if the carrier is not received before the predetermined time, then turning off the switch; and
- (S34) analyzing the first packet and transmitting the carrier having the second packet, and then turning on or turning off the switch according to the second packet.

* * * * *